United States Patent

De Jong et al.

[11] Patent Number: 5,963,038
[45] Date of Patent: *Oct. 5, 1999

[54] METHOD OF TESTING A CONNECTION WHICH INCLUDES A CONDUCTOR IN AN INTEGRATED CIRCUIT

[75] Inventors: Franciscus G. M. De Jong; Johannes De Wilde, both of Eindhoven, Netherlands

[73] Assignee: U.S. Philips Corporation, New York, N.Y.

[*] Notice: This patent is subject to a terminal disclaimer.

[21] Appl. No.: 08/870,063

[22] Filed: Jun. 5, 1997

Related U.S. Application Data

[63] Continuation-in-part of application No. 08/795,156, Feb. 7, 1997.

[30] Foreign Application Priority Data

Jun. 6, 1996 [EP] European Pat. Off. .............. 96201569

[51] Int. Cl.$^6$ ..................................................... G01R 31/02
[52] U.S. Cl. .......................... 324/537; 324/127; 324/529
[58] Field of Search .................................. 324/523, 527, 324/529, 537, 127; 235/492

[56] References Cited

U.S. PATENT DOCUMENTS

| 4,186,338 | 1/1980 | Fitchenbaum | 324/537 |
| 5,485,080 | 1/1996 | Larrabee et al. | 324/529 |
| 5,773,812 | 6/1998 | Kreft | 235/492 |

FOREIGN PATENT DOCUMENTS

| 4211548 | 10/1993 | Germany . |
| 4430243 | 3/1995 | Germany . |

*Primary Examiner*—Diep N. Do
*Attorney, Agent, or Firm*—Brian J. Wieghaus

[57] ABSTRACT

An integrated circuit includes a sensor which is arranged in the vicinity of a conductor in the circuit and is capable of measuring the current through the conductor. This sensor, for example constructed as a coil, is capable of determining whether a connection which includes the conductor is in order. It can thus be tested notably whether the possibly multiple supply connection of the integrated circuit is appropriately connected to an external connection terminal.

18 Claims, 4 Drawing Sheets

METHOD OF TESTING A CONNECTION WHICH INCLUDES A CONDUCTOR IN AN INTEGRATED CIRCUIT

This application is a continuation-in-part of Ser. No. 08/795,156 filed Feb. 7, 1997.

BACKGROUND OF THE INVENTION

The invention relates to a method of testing a connection which includes a conductor in an integrated circuit, the conductor being coupled to an external connection terminal of the integrated circuit, which method includes the following steps:

applying a stimulus to the external connection terminal, detecting a response in the conductor in the integrated circuit, characterizing the functioning of the connection on the basis of the response.

The invention also relates to an integrated circuit which includes a conductor for conducting a current and a detection device for characterizing a current through the conductor.

A method and an integrated circuit of this kind are known from U.S. Pat. No. 5,068,604 in the name of Applicant. The known integrated circuit includes a plurality of supply connections, each of which is connected to a common supply source, the supply connections also being internally interconnected. The test aims to check whether each of the supply connections is correctly connected to the supply source and conducts a relevant part of the supply current to the internal part of the circuit. To this end, a voltage difference is measured across some internal points in the conductor and it is checked whether this voltage difference remains within a given margin. To this end, the known integrated circuit includes a comparison circuit for comparing the voltage difference. A problem encountered while using this test method is the fact that the voltage difference to be measured is small since the conductor has a low, process-dependent resistance so that it is difficult to execute the above test. A further problem consists in that the complexity of the test increases as there are more supply connections, each of which is connected to a common supply source.

SUMMARY OF THE INVENTION

It is an object of the invention to provide a method of the kind set forth which can be more readily carried out and offers improved fault detection in comparison with the known method. To this end, the method in accordance with the invention is characterized in that the detection involves the measurement of current through the conductor by means of a sensor situated within the integrated circuit in the vicinity of the conductor in the integrated circuit. The measurement of the current through the conductor by the sensor is a suitable method of determining whether the relevant connection terminal is externally connected and/or whether the conductor functions correctly. There is the advantage that in a situation in which the conductor carries a constant current, this current is not at all influenced by the sensor. When the integrated circuit includes several external connection terminals and associated conductors, these conductors can be tested independently of one another when each conductor is provided with a respective sensor. The sensor can be constructed in various ways so as to measure the field produced by the current through the conductor. Examples in this respect are a Hall sensor, an MR (magnetoresistive) sensor and a GMR (giant magnetoresistive) sensor.

In a version of the method according to the invention the stimulus has a time dependent behaviour and the detecting of the response involves the measurement of dynamic behaviour of the current through the conductor by means of the sensor. Such a dynamic test method allows the detection of smaller signals and provides a more reliable assessment as to whether the connection and the conductor function properly. Furthermore, the application of a dynamic stimulus makes it possible to use a coil as sensor for detecting the response. The dynamic stimulus causes a change in current through the conductor, which causes an induction voltage in the coil near the conductor. This voltage can be detected and used to assess the connection.

In a version of the method according to the invention the measured result is converted into a digital signal. The digital signal can be simply processed in the integrated circuit. For example, when it has thus been established that a supply connection is not connected to the supply source, the circuit can enter a mode which requires less current. The digital signal can also be fed out from the integrated circuit as an indication of correct or incorrect functioning of the relevant connection.

In a version of the method according to the invention the integrated circuit receives a supply voltage via a supply connection, the conductor being coupled to the supply connection in order to conduct a supply current. When the method according to the invention is used for a circuit with multiple supply connections and associated conductors, it can be determined whether each of the supply connections is correctly connected to the supply source. This is important, for example for operation of the integrated circuit within specifications and also for the service life of the integrated circuit.

In a version of the method of the invention the application of the stimulus involves a momentary decrease of the supply voltage in order to cause a variation of the supply current through the conductor. Decreasing the supply voltage is a simple way of realizing a variation of the current through the conductor. This variation produces a signal in the sensor, for example an induction voltage in the coil when a coil is used as the sensor; this signal can be measured and processed.

In a version of the method of the invention the integrated circuit includes one or more inputs for receiving patterns, the application of the stimulus involving the presentation of at least two predetermined patterns to the inputs in order to cause a variation of the supply current through the conductor. Because the transition from one pattern to the other pattern causes a variation of the supply current, a signal can thus be simply generated in the sensor. A tester can simply present the patterns as part of the test patterns already present and can record the response thereto, possibly in digital form.

In a version of the method of the invention the application of the stimulus involves the presentation of a test signal of predetermined frequency to the external connection terminal. Because the sensor, for example the coil and the associated circuit section, is sensitive to signals of a frequency in a given frequency band, a test signal having such a frequency can be presented to the connection terminal whereto the conductor is coupled, after which it can be measured whether the sensor receives this signal. The connection can thus also be tested for correct functioning.

It is a further object of the invention to provide an integrated circuit of the kind set forth which can be tested more easily than the known integrated circuit. To achieve this, the integrated circuit according to the invention is characterized in that the detection device includes a sensor arranged in the vicinity of the conductor in order to characterize the current. The characterization of the current can be used to determine whether an externally applied stimulus has influence on the conductor. It can thus be simply detected whether the integrated circuit is connected to an external connection and whether the relevant connection functions correctly. It is notably when a plurality of conductors are to be connected to the same external connection (as is the case, for example for multiple supply pins) that the invention enables simple testing whether each of the supply pins is indeed connected to the external connection.

In an embodiment of the integrated circuit according to the invention the sensor includes a coil. A coil is an inexpensive sensor which can be readily implemented in the integrated circuit so as to measure a variation of the current. The coil can be formed during the same process steps as the other conductors of the integrated circuit.

In an embodiment of the integrated circuit according to the invention the coil includes two series-connected sub-coils which are situated to opposite sides of the conductor and have a mutually opposed winding sense. Due to the opposed winding sense of the sub-coils, the assembled coil is less sensitive to interference fields external of the conductor because of the common mode rejection then occurring. Furthermore, the sensitivity of the composite coil to a field generated by a current variation in the conductor is thus enhanced. The testing of the connection will thus be more reliable.

In an embodiment of the integrated circuit according to the invention the detection device includes a peak detector which is coupled to the sensor in order to convert a voltage to be measured in the sensor into a digital signal. The digital signal can be more readily processed or fed out from the integrated circuit.

An embodiment of the integrated circuit according to the invention includes a Boundary Scan Test cell for storing the digital signal. The connection can be easily tested in conformity with the Boundary Scan Test standard.

These and other aspects of the invention will be apparent from and elucidated with reference to the embodiments described hereinafter.

DESCRIPTION OF THE PREFERRED EMBODIMENTS

Figure 1:
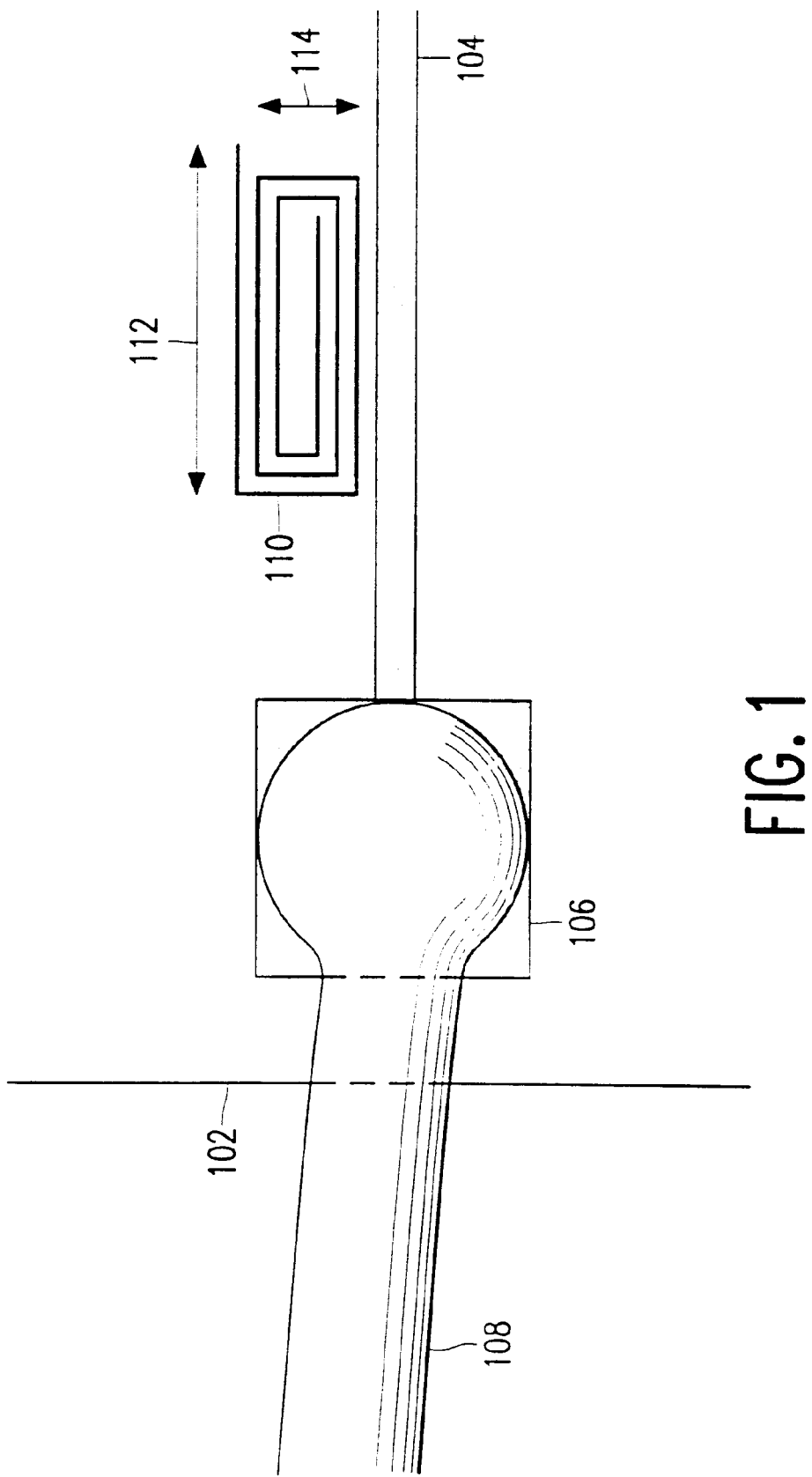
FIG. 1 shows a part of an integrated circuit according to the invention.

Corresponding reference numerals in the drawing denote corresponding or similar parts.

FIG. 1 shows a part of an integrated circuit according to the invention. The integrated circuit 102 includes a conductor 104 which is coupled to a so-called bond pad 106. The integrated circuit also includes (not shown) an internal section of the circuit, for example an electronic circuit which has a given functionality, is connected to the conductor, and is optionally packed in a package with pins. Signals can be exchanged between the external environment and the circuit within the package. The bond pad 106 is connected to such a pin or directly to the external environment by way of a bond wire 108. The connection of the integrated circuit to a supply voltage is an example of the foregoing. The package is then mounted on a printed circuit board (PCB), the relevant pin then being connected to a supply track for the supply voltage on the PCB. The complete connection thus formed includes the following parts: a coupling from the supply track to the pin of the package, a coupling from the pin to the bond wire 108, a coupling from the bond wire to the bond pad 106, a coupling from the bond pad 106 to the conductor 104, and finally a coupling from the conductor 104 to the integrated circuit. The integrated circuit 102 also includes a coil 110 which is situated adjacent the conductor 104. Because the coil is situated near the conductor, inductive coupling exists between the conductor and the coil. Therefore, a variation of the current through the conductor 104 will cause an induction voltage in the coil 110. This coil thus enables testing as to whether the described complete connection is in order. For example, a pulse is then applied to the supply track of the PCB and it is measured whether the associated induction voltage arises in the coil 110. A fault in the connection, for example no contact between the pin of the package and the supply track on the PCB or a faulty bond wire, can thus be simply detected.

The described method of testing a connection can be very advantageously used for an integrated circuit including multiple supply pins and ground pins. Each supply pin and each ground pin then has a connection as described above, including: a pin, a bond wire, a bond pad and a conductor in the integrated circuit. Two circuits marketed by Philips are examples of such integrated circuits, i.e. the SAA 4990 video processor IC with 8 supply pins and 8 ground pins, and the SAA 4991 video processor IC with 7 supply pins and 13 ground pins. Multiple construction of such pins in circuits of this kind is necessary inter alia in order to conduct the required comparatively large supply current to different parts of the integrated circuit via different conductors, and also to achieve a given quality in respect of signal processing. All of the multiple supply pins must usually be connected to the same supply track of the PCB and the multiple ground pins to the same ground track of the PCB. Should one of the pins not be connected, the integrated circuit will operate nevertheless because all parts still receive current via internal connections, however, the operation of the circuit will not satisfy all specifications or the service life of the circuit will be reduced. When a coil is inserted for each conductor coupled to a supply pin or to a ground pin, each individual connection can be checked as to whether it is in order. This can be realized by applying a stimulus to the supply track or to the ground track and measuring whether the associated induction voltage is generated in the relevant coils.

When the integrated circuit includes a plurality of conductors along which a coil is arranged so as to test these conductors, it is advantageous to make at least parts of adjacent conductors extend mutually perpendicularly and to arrange the coils adjacent said mutually perpendicular parts. Adjacent coils are thus arranged perpendicularly to one another so that the coupling between a conductor and the coils, if any, of adjacent conductors is minimized.

The coil 110 can be realized in the integrated circuit by the same process as used to form the other conductor tracks for the integrated circuit. In an embodiment of the integrated circuit according to the invention the coil is composed of a track having a width of 2 $\mu$m and comprises three turns. The length 112 of the coil amounts to approximately 100 $\mu$m and its width 114 to approximately 35 $\mu$m. In an alternative embodiment the coil comprises nine turns; to this end it is constructed as a stack comprising three layers of three turns each. The process used to construct the integrated circuit should then be suitable for forming multilayer metal layers in the integrated circuit.

The invention is by no means restricted to the foregoing example concerning the testing of a supply or ground connection of an integrated circuit. The invention can also be used for a so-called Multi Chip Module, in which a number of integrated circuits are combined so as to form one unit. In such an assembly integrated circuits can also be provided with a coil adjacent a conductor for a given current, thus enabling testing of the connection. The invention can also be used for conductors for a current other than a supply current. In that case the relevant connection can again be tested by means of a coil arranged adjacent the conductor.

Figure 2:
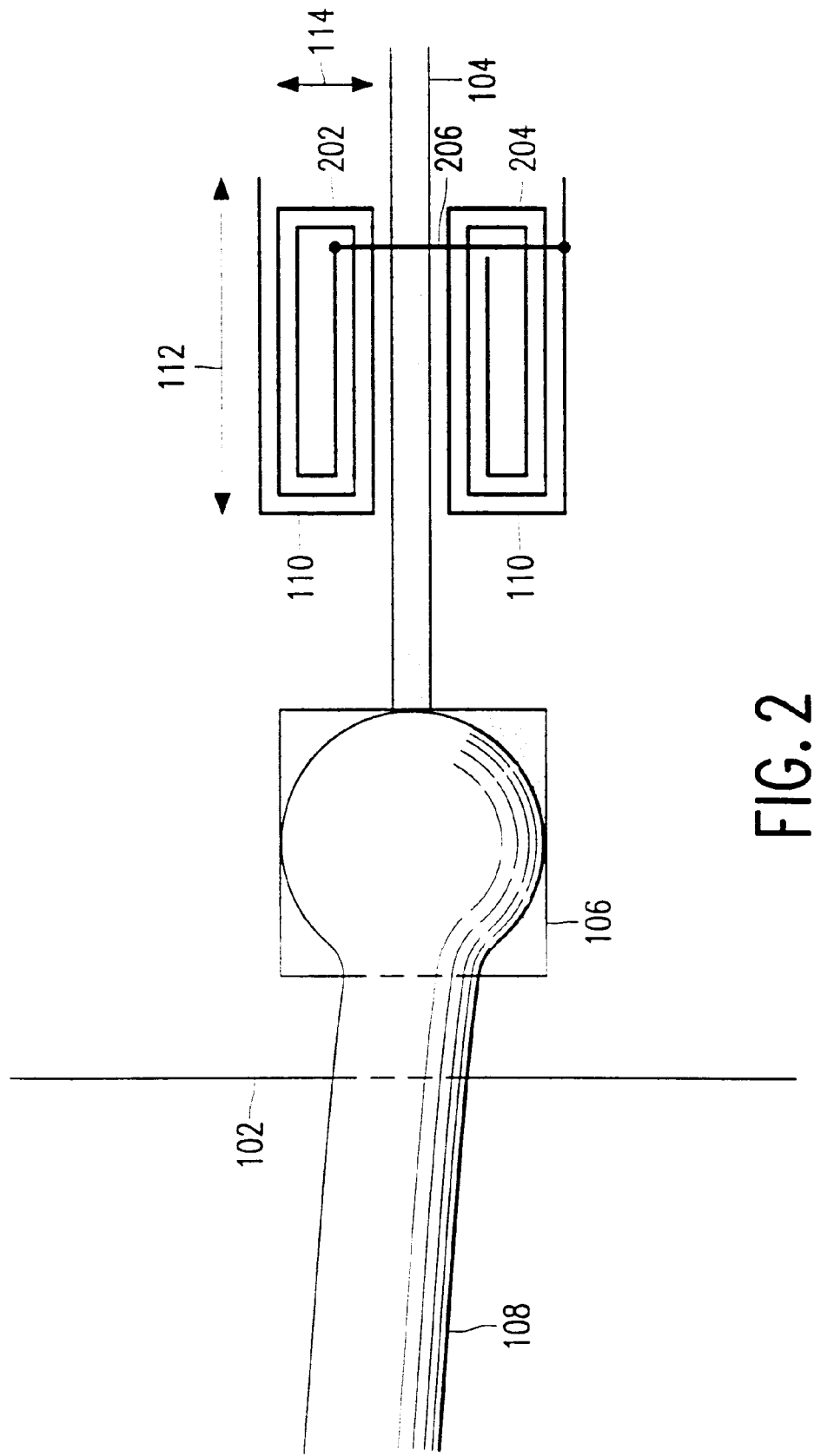
FIG. 2 shows an alternative embodiment of the coil in the integrated circuit according to the invention.

FIG. 2 shows an alternative embodiment of the coil in the integrated circuit according to the invention. The coil 110 now comprises two sub-coils 202 and 204 which are arranged to both sides of the conductor 104. The sub-coils are interconnected via a track 206 and have a mutually opposed winding sense. An interference field passing through the sub-coils in the same direction will induce opposed voltages in the sub-coils, which voltages attenuate one another. This effect is referred to as common mode rejection. The coil as a whole, therefore, is less sensitive to such interference fields than a single coil. A field generated by a current variation in the conductor extends circularly around the conductor. As a result, this field passes through one sub-coil in one direction and through the other sub-coil in the opposite direction. Because of the opposed winding sense of the sub-coils, the induction voltages of the sub-coils intensify one another so that the coil as a whole delivers a higher voltage. In comparison with a single coil the composite coil shown in FIG. 2 produces, a higher induction voltage for a given current variation in the conductor and it is also less sensitive to interference. As a result, smaller current variations can be measured and the current variations can also be measured more reliably.

Figure 3:
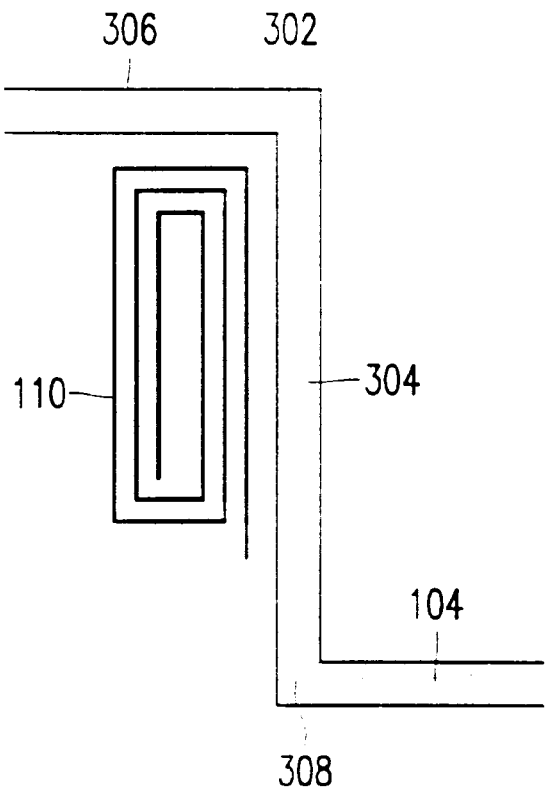
FIG. 3 shows an alternative arrangement of the coil in the integrated circuit according to the invention.

FIG. 3 shows an alternative arrangement of the coil in the integrated circuit according to the invention. The conductor 104 extends at a given angle 302 and the coil 110 is situated within the area enclosed by said angle. When a current variation occurs in the conductor 104, the field around the conductor portion 304 as well as the field around the conductor portion 306 will pass through the coil 110. As a result, an induction voltage arises in the coil which is higher than if the coil were situated adjacent a completely straight conductor. The conductor shape shown in FIG. 3 yields a higher inductive coupling between the conductor and the coil. Furthermore, a second coil can again be used as described with reference to FIG. 2. This second coil can be arranged in the area enclosed by the angle 308.

Figure 4:
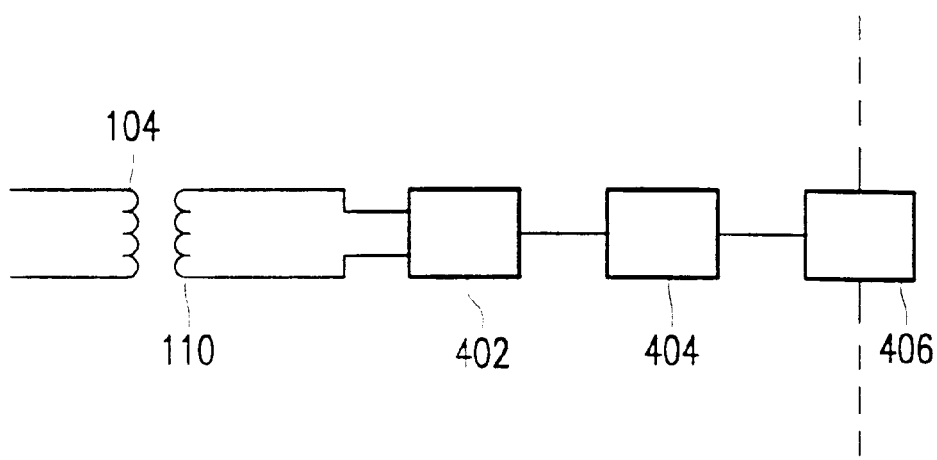
FIG. 4 shows diagrammatically a method of processing the induction voltage.

The induction voltage can be processed completely within the integrated circuit, but can also be fed out from the integrated circuit as a response signal. An example of complete local processing consists in that given parts of the circuit are switched on or off in dependence on whether or not the conductor carries a current. Feeding out the response signal is suitable as part of the testing of the fixation of the integrated circuit on a printed circuit board. A tester then presents given test signals and receives the response signals from the integrated circuit via an appropriate output. FIG. 4 shows diagrammatically an example of the processing of the induction voltage. The induction voltage is then applied from the coil 110 to an amplifier 402. The output of the amplifier is connected to a peak detector 404 which checks whether or not the amplified signal exceeds a given threshold during a given period. The peak detector produces a digital value which indicates whether or not the threshold has been exceeded. The digital value "1" then signifies, for example that the threshold has been exceeded and the digital value "0" that it has not been exceeded. The amplifier 402 is known per se and should be suitable to amplify a signal of the order of 1 mV to an output voltage of approximately 1 V. A peak detector 404 is also known and is described, for example in European Patent Application Number 95202835.5/ in U.S. patent application Ser. Nos. 08/734,009 08/734,009 filed Oct. 18, 1996 in the name of Applicant. The value generated by the peak detector is stored in a register 406 via which it can be fed out. An example of a register 406 consists of a Boundary Scan Test (BST) cell which forms part of the BST chain of the integrated circuit. The BST cell enables testing of the connection in conformity with the BST standard method. Furthermore, the connection can then be tested internally and externally of the integrated circuit in the same way as the other connections. In this embodiment of the integrated circuit in accordance with the invention the amplifier and the peak detector are included in the integrated circuit; however, they could also be constructed so as to be external of the integrated circuit, for example as part of the test environment. Furthermore, in order to carry out the invention the use of a peak detector 404 and a register 406 is optional and the response on the basis of the induction voltage in the coil 110 can also be fed out from the integrated circuit in other ways.

According to the described method a stimulus is applied to the connection to be tested, said stimulus causing a current variation in the relevant conductor in the integrated circuit if the connection is in order. Such a stimulus can be realized in various ways. For the testing of a connection to a power supply, being a connection to the supply source as well as a connection to ground, the stimulus can be applied by momentarily decreasing the supply voltage. This causes a variation of the current through the relevant conductor, which variation results in an induction voltage in the coil adjacent the conductor. When the voltage is decreased only to such an extent that the peak detector and the register described with reference to FIG. 4 continue to operate, the response can be output in the described manner. Another possibility of applying a stimulus for these connections is to utilize the phenomenon that the integrated circuit requires a small supply current in a given state and a large supply current in another state. An example of a state in which the circuit requires a comparatively large supply current is a state in which all of the output buffers output the logic values requiring most current according to the relevant technology. Depending on the technology used, this is a logic "1" or a logic "0". Such switching of the circuit from one state to the other can be realized by means of BST, because this method enables control of the output buffers of the circuit. The use of BST is appropriate if the circuit already includes the BST logic. However, there are also other ways of controlling the buffers, for example on the basis of functional signals on the inputs of the circuit yielding an output signal consisting of logic "1"s. It is to be noted that not the absolute value of the supply current is relevant but only the difference between the values of the supply currents in the different states. Switching the circuit from one state to the other state causes a variation in the supply current through the relevant conductors, resulting in an induction voltage in the relevant coils. Checking whether the associated induction voltage is indeed generated in each of the coils reveals whether each of the supply connections is indeed connected. A further method of stimulus application which is suitable for supply connections as well as for other connections involves presentation of a test signal of a given frequency. A given combination of coil and conductor is sensitive to signals in a given frequency band. The relevant connection can be tested by applying a test signal having a frequency within said frequency band to the external track and by checking whether an induction voltage arises in the coil of the conductor to be tested. A test signal of this kind can be superposed on the supply voltage, if any, without damaging the integrated circuit.

Figure 5:
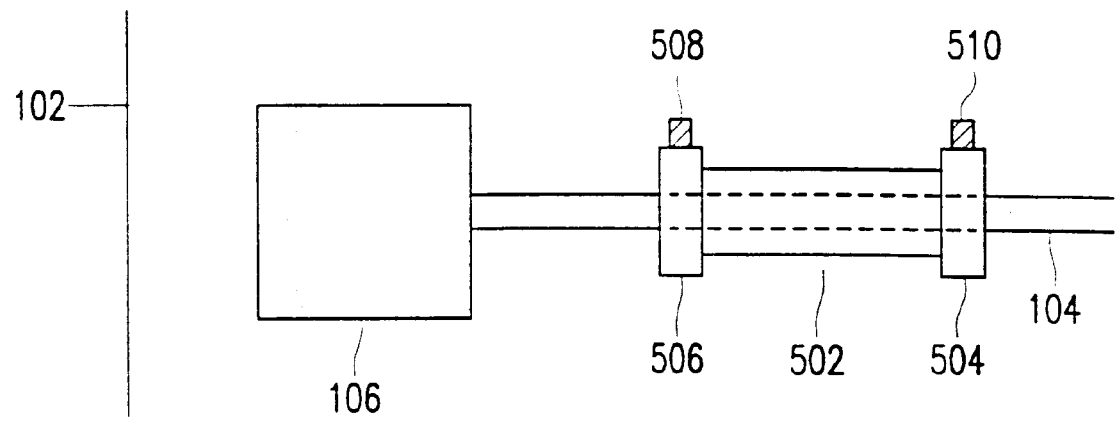
FIG. 5 shows an alternative embodiment of the sensor in the integrated circuit according to the invention.

FIG. 5 shows an alternative embodiment of the sensor in the integrated circuit according to the invention. An MR (magnetoresistive) sensor 502 is situated near conductor 104 in a layer of the integrated circuit above or beneath the layer in which the conductor is realised. The MR sensor comprises connection areas 504 and 506 to which through holes 508 and 510 are connected for measuring the actual resistance of the sensor. An MR sensor has a resistance that is dependent on an external magnetic field through the plane of the sensor. Different types of MR sensors exist. The traditional MR sensor has a layer of anisotropical magnetic material and current through this layer is influenced by an external magnetic field, which causes the change in resistance. The GMR (Giant MagnetoResistive) sensor has a layer of magnetic material in a fixed direction and a layer of magnetic material of which the magnetic direction can be influenced by an external magnetic field, which causes the change in measured resistance. Depending on the type and construction, an MR sensor is more sensitive in one direction and less sensitive in another direction in the plane of the sensor. The MR sensor 502 is constructed in such a way so as to obtain a large effect from the current through the conductor on the resistance of the sensor. The current through the conductor causes a circular magnetic field around the conductor through the plane of the sensor and perpendicular to the conductor in the plane of the sensor. The MR sensor 502 is sensitive in this direction and therefore suitable to measure the strength of the magnetic field produced by direct current through the conductor. Based on this strength the value of the direct current can be determined. So the MR sensor can be used to determine whether the conductor carries the expected current. This can be used to determine whether the relevant connection terminal is externally connected and/or whether the conductor functions correctly. If multiple MR sensors are used to measure the current through respective conductors, the MR sensor could be connected to each other so as to form a bridge arrangement. The current can then be measured in a more accurate way. According to the invention, a traditional MR sensor or a GMR (giant magnetoresistive) sensor can be used. A GMR sensor is more sensitive than an MR sensor and can more reliably measure the current through the conductor.

Alternative to the static measurements, the MR sensor can be used to determine any dynamic behaviour of current through the conductor. When a dynamic stimulus is externally applied, a corresponding variation in the current through the conductor should take place if the terminal is properly connected and the conductor as a whole functions properly. This variation in current causes a variation in the magnetic field through the MR sensor which can be detected by this sensor. So the MR sensor can also be applied to perform a dynamic test.

Figure 6:
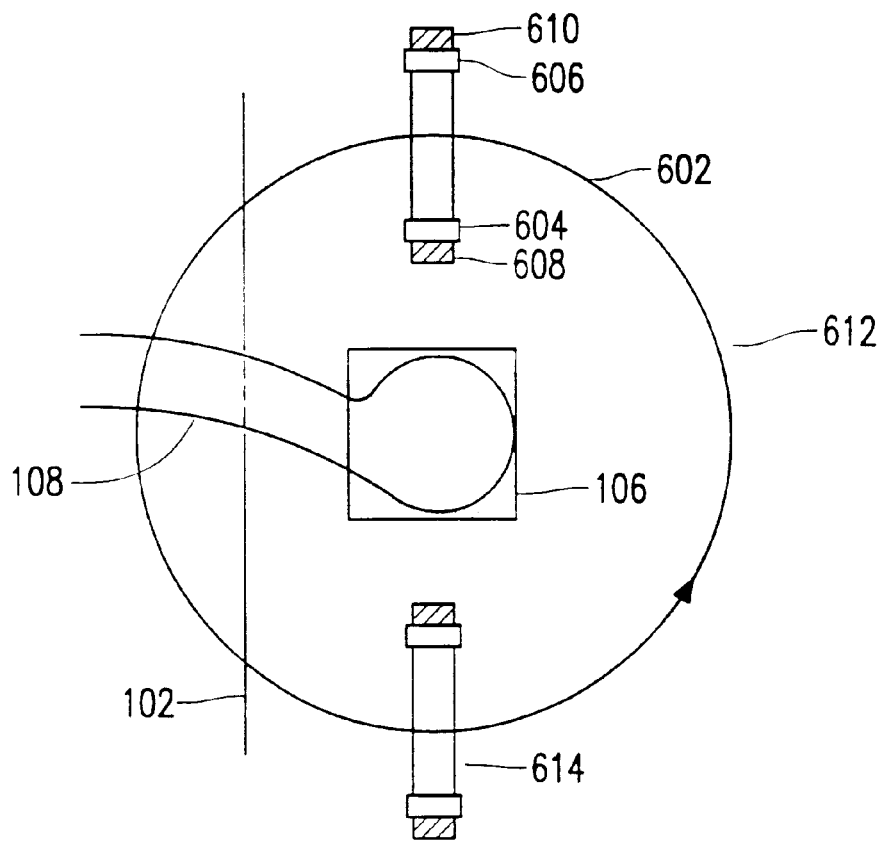
FIG. 6 shows an alternative arrangement of the MR sensor in the integrated circuit according to the invention.

FIG. 6 shows an alternative arrangement of the MR sensor in the integrated circuit according to the invention. An MR sensor 602 is situated near the bond pad 106 to which the bond wire 108 is connected. The MR sensor 602 has connection areas 604 and 606 that connect the sensor to respective through holes 608 and 610. The typical attachment of the bond wire 108 to the bond pad 106 is such that near the bond pad the bond wire is to a certain degree perpendicular to the surface of the bond pad. A current through the bond wire then causes a magnetic field 612 in the plane of the bond pad and the MR sensor, thus causing a change of the resistance of the MR sensor which change can be detected. A second MR sensor 614 may be situated at another side of the bond pad and combined with the MR sensor 602 in order to obtain an arrangement that is more sensitive to the magnetic field 612 than a single MR sensor. In FIG. 6, the MR sensors are positioned perpendicular to the magnetic field 612. However, they may be positioned under a different angle with the magnetic field if they would be more sensitive in a different direction.

At a connection layer of the circuit, the through holes e.g. 508–510 and 608–610, are connected to connection tracks connecting the respective MR sensor to some internal detection circuit or to external measurement points. The resistance of the MR sensor can then be measured inside in the integrated circuit with the detection circuit or outside the integrated circuit with a suitable measurement arrangement.

We claim:

1. A method of testing a connection which includes a conductor in an integrated circuit, the conductor being coupled to an external connection terminal of the integrated circuit, which method includes the following steps:

applying a stimulus to the integrated circuit in order to form a response in the conductor, detecting a response in the conductor in the integrated circuit, characterizing the functioning of the connection on the basis of the response, characterized in that the detecting of the response involves the measurement of current through the conductor by a sensor situated in the integrated circuit in the vicinity of the conductor.

2. A method as claimed in claim 1, in which the stimulus has a time dependent behaviour and in which the detecting of the response involves the measurement of dynamic behaviour of the current through the conductor by the sensor.

3. A method as claimed in claim 1, in which the sensor comprises a coil and the measurement of the dynamic current behavior involves the measurement of an induction voltage in the coil.

4. A method as claimed in claim 2, in which the integrated circuit includes a circuit coupled to the coil for converting the measured result into a digital signal.

5. A method as claimed in claim 1, in which the integrated circuit receives a supply voltage via a supply connection, the conductor being coupled to the supply connection in order to conduct a supply current.

6. A method as claimed in claim 5, in which the application of the stimulus involves a momentary decrease of the supply voltage in order to cause a variation of the supply current through the conductor.

7. A method as claimed in claim 5, in which the integrated circuit includes one or more inputs for receiving patterns, the application of the stimulus involving the presentation of at least two predetermined patterns to the inputs in order to cause a variation of the supply current through the conductor.

8. A method as claimed in claim 1, in which the application of the stimulus involves the presentation of a test signal of predetermined frequency to the external connection terminal.

9. A method according to claim 1, wherein a steady state current is detected by the sensor.

10. An integrated circuit, comprising:
   a conductor for conducting a current; and
   a sensor arranged within the integrated circuit in the vicinity of the conductor in order to characterize the current.

11. An integrated circuit as claimed in claim 10, in which the sensor includes a coil to detect a variation of the current.

12. An integrated circuit as claimed in claim 11, in which the coil includes two series-connected sub-coils which are situated to opposite sides of the conductor and have a mutually opposed winding sense.

13. An integrated circuit as claimed in claim 11, in which the coil includes at least two layers with windings.

14. An integrated circuit as claimed in claim 11, in which the conductor is shaped so as to include a bend, the coil being arranged in an area enclosed by the bend.

15. An integrated circuit as claimed in claim 10, in which the sensor includes an MR sensor.

16. An integrated circuit as claimed in claim 10, in which the detection device includes a peak detector which is coupled to the sensor in order to convert a voltage to be measured in the sensor into a digital signal.

17. An integrated circuit as claimed in claim 16, which includes a Boundary Scan Test cell for storing the digital signal.

18. An integrated circuit according to claim 10, wherein the sensor detects a steady state current in the conductors.

* * * * *